(12) United States Patent
Takahashi et al.

(10) Patent No.: US 11,342,192 B2
(45) Date of Patent: May 24, 2022

(54) SUBSTRATE PROCESSING METHOD AND STORAGE MEDIUM

(71) Applicant: TOKYO ELECTRON LIMITED, Tokyo (JP)

(72) Inventors: Nobuhiro Takahashi, Nirasaki (JP); Yasuo Asada, Nirasaki (JP); Junichiro Matsunaga, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/498,796

(22) PCT Filed: Mar. 19, 2018

(86) PCT No.: PCT/JP2018/010713
§ 371 (c)(1),
(2) Date: Sep. 27, 2019

(87) PCT Pub. No.: WO2018/180670
PCT Pub. Date: Oct. 4, 2018

(65) Prior Publication Data
US 2020/0105539 A1    Apr. 2, 2020

(30) Foreign Application Priority Data

Mar. 29, 2017  (JP) .............................. JP2017-065965

(51) Int. Cl.
*H01L 21/311* (2006.01)
*H01L 21/02* (2006.01)

(52) U.S. Cl.
CPC .. *H01L 21/31116* (2013.01); *H01L 21/02164* (2013.01); *H01L 21/02205* (2013.01); *H01L 21/02532* (2013.01)

(58) Field of Classification Search
None
See application file for complete search history.

(56) References Cited

U.S. PATENT DOCUMENTS

2007/0042569 A1* 2/2007 Dip ................... H01L 21/02532
                                                          438/478
2010/0203739 A1  8/2010 Becker et al.
2011/0062417 A1* 3/2011 Iwayama ............ H01L 29/0673
                                                            257/24

(Continued)

FOREIGN PATENT DOCUMENTS

JP    H1-92385 A    4/1989
JP    2009-510750 A    3/2009
(Continued)

*Primary Examiner* — Stephanie P Duclair
(74) *Attorney, Agent, or Firm* — Nath, Goldberg & Meyer; Jerald L. Meyer; Tanya E. Harkins

(57) ABSTRACT

A technique for making etching amounts uniform in selectively etching SiGe layers formed on a wafer with respect to at least one of an Si layer, an $SiO_2$ layer, and an SiN layer is provided. In an etching process where SiGe layers in a wafer W in which the SiGe layers and Si layers are alternately stacked and exposed in a recess are removed by side etching, $ClF_3$ gas and HF gas are simultaneously supplied to the wafer W. Accordingly, it is possible to make the etching rates for respective SiGe layers uniform, and it becomes possible to obtain a uniform etching amount for respective SiGe layers.

8 Claims, 16 Drawing Sheets

(56) References Cited

U.S. PATENT DOCUMENTS

| | | | | |
|---|---|---|---|---|
| 2014/0342569 A1* | 11/2014 | Zhu | ................ | H01L 21/32137 438/710 |
| 2015/0126040 A1* | 5/2015 | Korolik | ................ | H01L 29/165 438/718 |
| 2016/0225637 A1* | 8/2016 | Takahashi | ......... | H01L 21/32135 |

FOREIGN PATENT DOCUMENTS

| | | |
|---|---|---|
| JP | 2011-29503 A | 2/2011 |
| JP | 2011-66151 A | 3/2011 |
| KR | 20-0193954 Y1 | 8/2000 |
| KR | 200193954 Y1 | 8/2000 |
| KR | 10-2010-0040726 A | 4/2010 |
| KR | 1020100040726 A | 4/2010 |
| KR | 10-2013-0025357 A | 3/2013 |
| KR | 1020130025357 A | 3/2013 |
| KR | 10-2016-0003225 A | 1/2016 |
| KR | 1020160003225 A | 1/2016 |

\* cited by examiner

SUBSTRATE PROCESSING METHOD AND STORAGE MEDIUM

TECHNICAL FIELD

The present disclosure relates to a technique for etching SiGe formed on a substrate.

BACKGROUND

In recent years, in a semiconductor manufacturing process, for example, in a gate forming process, a step of selectively removing SiGe layers by side-etching a semiconductor wafer (hereinafter referred to as a "wafer") in which the silicon germanium (SiGe) layers and silicon (Si) layers are stacked is performed. As a method of selectively removing the SiGe layers, for example, a method of performing etching by supplying chlorine trifluoride ($ClF_3$) gas is known as described in Patent Documents 1 and 2. The $ClF_3$ gas has a high etching selection ratio of the SiGe layer with respect to an Si layer, a silicon oxide ($SiO_2$) layer, and a silicon nitride (SiN) layer, and is capable of selectively removing the SiGe layer.

In such a semiconductor wafer, for example, in the pre-processing of etching of the SiGe layers, a step of etching the wafer in which the SiGe layers and the Si layers are alternately stacked is performed to expose the surface in which the SiGe layers and the Si layers are alternately arranged. Thereafter, $ClF_3$ gas is supplied to the wafer to etch a part of each SiGe layer, but there is a problem in that the etching amount of each SiGe layer is not uniform, and a countermeasure has been required.

PRIOR ART DOCUMENT

Patent Document

Japanese Laid-Open Patent Publication No. 2009-510750
Japanese Laid-Open Patent Publication No. H01-92385

The present disclosure has been made in view of the foregoing situation, and an object of the present disclosure is to provide a technique of making etching amounts uniform in selectively etching silicon germanium layers formed on a substrate with respect to at least one of a silicon layer, a silicon oxide layer, and a silicon nitride layer.

SUMMARY

According to one embodiment of the present disclosure, there is provided an etching method of etching a silicon germanium layer in a substrate in which the silicon germanium layer and at least one of a silicon layer, a silicon oxide layer, and a silicon nitride layer are exposed, the method including simultaneously supplying a fluorine-containing gas and a chlorine trifluoride gas to the substrate in a processing container, which is in a vacuum atmosphere.

According to another embodiment of the present disclosure, there is provided a storage medium storing a computer program used in a substrate processing apparatus that supplies a gas to a substrate in a processing container having a vacuum atmosphere so as to perform a process, wherein the computer program has a group of steps programmed for carrying out the substrate processing method described above.

In the present disclosure, in etching silicon germanium layers on a substrate in which the silicon germanium layers and at least one of a silicon layer, a silicon oxide layer, and a silicon nitride layer are exposed, a fluorine-containing gas and a chlorine trifluoride gas are simultaneously supplied to the substrate. Therefore, the etching rates of the silicon germanium layers become uniform, so that it is possible to make the etching amounts uniform.

DETAILED DESCRIPTION

Figure 1:
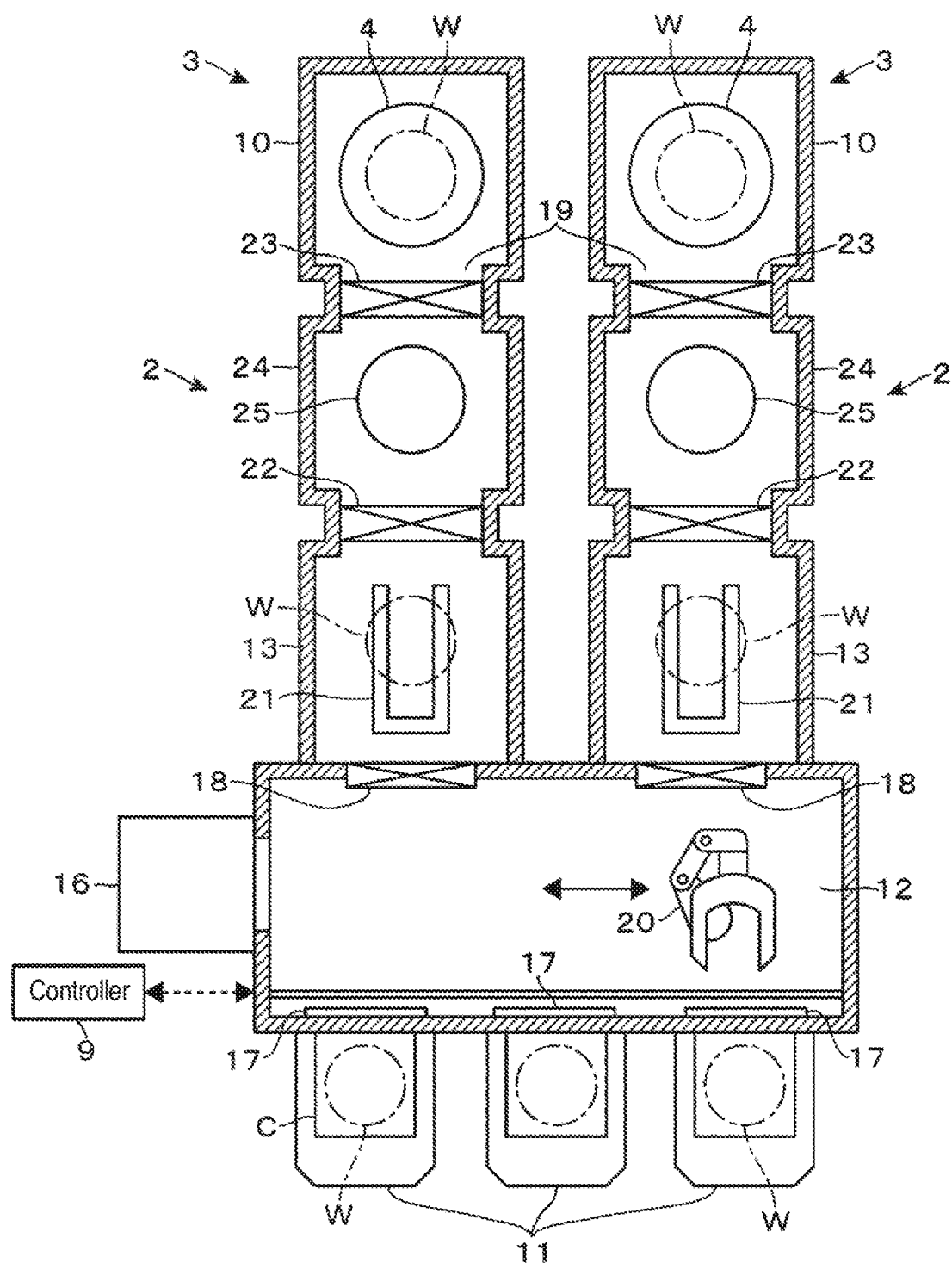
FIG. 1 is a plan view illustrating a substrate processing apparatus provided with etching apparatuses.

An etching apparatus used for a substrate processing method according to an embodiment of the present disclosure will be described. FIG. 1 illustrates a substrate processing apparatus provided with etching apparatuses 3 to perform a substrate processing method. As illustrated in FIG. 1, the substrate processing apparatus is provided with a horizontally-long normal-pressure transfer chamber 12, of which the internal atmosphere is formed as, for example, a normal-pressure atmosphere with nitrogen gas. For example, three load ports 11 for delivering substrates to carriers C for loading, for example, wafers W, which are substrates to be processed, are arranged in front of the normal-pressure transfer chamber 12.

Opening/closing doors 17, which are opened and closed together with lids (not illustrated) provided on the carriers C, are mounted on the front wall of the normal-pressure transfer chamber 12. A first transfer arm 20 configured as an articulated arm for transferring a wafer W is provided in the normal-pressure transfer chamber 12. Further, on the left side wall of the normal-pressure transfer chamber 12 when viewed from the load port 11 side, an alignment chamber 16 is provided to adjust the direction or eccentricity of a wafer W.

On the side opposite the load ports 11 in the normal-pressure transfer chamber 12, for example, two load-lock chambers 13 are arranged side by side and the inner atmosphere of each load-lock chamber is switched between the normal-pressure atmosphere and the vacuum atmosphere while the wafer W is on standby therein. A door valve 18 partitions the normal-pressure atmosphere transfer chamber 12 from each load-lock chamber 13. Each load lock chamber 13 is provided with a second transfer arm 21 configured as, for example, an articulated arm for horizontally supporting a wafer W.

A heat treatment apparatus 2 is provided on the rear side of each load-lock chamber 13 via a gate valve 22 when viewed from the normal-pressure transfer chamber 12 side, and an etching apparatus 3 is provided via a gate valve 23 on the further back side of the heat treatment apparatus 2. The second transfer arm 21 provided in each load-lock chamber 13 is configured to transfer a wafer W to the heat treatment apparatus 2 and to transfer the wafer W to the etching apparatus 3 through the heat treatment apparatus 2. The heat treatment apparatus 2 includes, for example, a vacuum container 24 and a mounting table 25 on which a wafer W is placed. The mounting table 25 is provided with a heating mechanism (not illustrated) for heating the wafer W placed thereon. In addition, lift pins (not illustrated) are provided on the mounting table 25, and the wafer W is delivered to the mounting table 25 by the cooperative action of the lift pins and the second transfer arm 21. The heat treatment apparatus 2 is configured to introduce $N_2$ gas into the vacuum container 24 and to evacuate the inside of the vacuum container 24.

Figure 2:
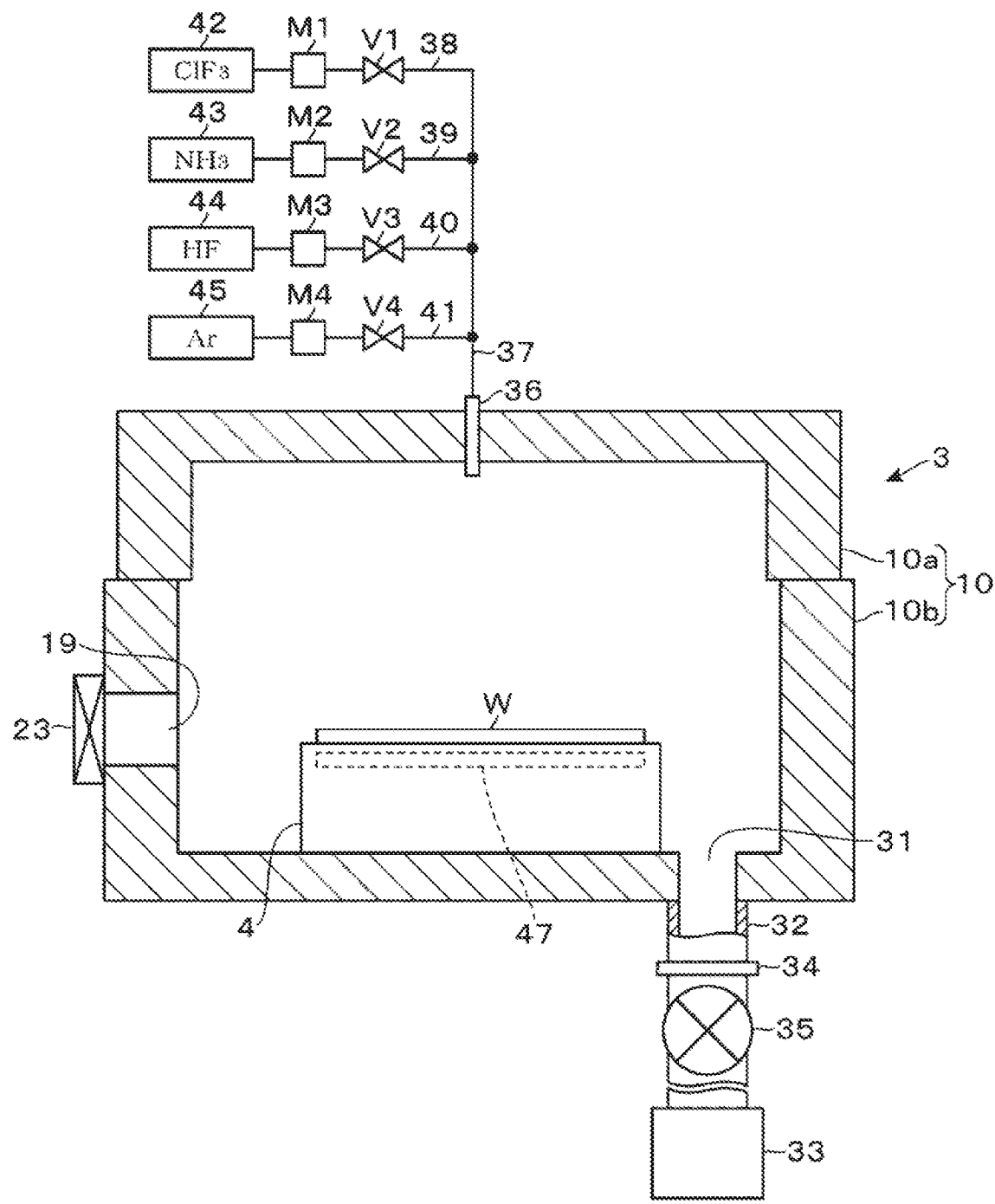
FIG. 2 is a cross-sectional view illustrating an etching apparatus.

An etching apparatus 3 will be described with reference to FIG. 2. As illustrated in FIGS. 1 and 2, the etching apparatus 3 includes a processing container 10, which is a vacuum chamber having a rectangular cross-sectional shape. The processing container 10 includes, for example, a ceiling plate part 10a and a main body part 10b, and a loading/unloading port 19 for delivering a wafer W is provided in the side surface of the main body part 10b. The loading/unloading port 19 is provided with the gate valve 23 described above for opening/closing the loading/unloading port 19.

A cylindrical mounting table 4 on which a wafer W is to be mounted is provided inside the processing container 10. In addition, the mounting table 4 is provided with lift pins (not illustrated), which project and retract from the upper surface of the mounting table 4. A temperature adjustment mechanism 47 for heating the wafer W is provided inside the mounting table 4, and the temperature of the wafer W placed on the mounting table 4 is adjusted to a set temperature, for example, 80 degrees C. An exhaust port 31 is provided at the bottom of the processing container 10. An exhaust pipe 32 is connected to the exhaust port 31, and a pressure adjustment part 34 and an opening/closing valve 35 are interposed in the exhaust pipe 32 from the exhaust port 31 side and are connected to a vacuum exhaust pump 33, which is a vacuum exhaust mechanism.

The ceiling plate part 10a is provided with a gas inlet portion 36 for introducing a gas into the processing container 10. A gas supply path 37 is connected to the gas inlet portion 36, and one end of each of a $ClF_3$ gas supply path 38, an ammonia ($NH_3$) gas supply path 39, a hydrogen fluoride (HF) gas supply path 40, and an argon (Ar) gas supply path 41 are connected to the gas supply path 37. A $ClF_3$ gas supply source 42, an $NH_3$ gas supply source 43, an HF gas supply 44, and an Ar gas supply source 45 are connected to the other ends of the $ClF_3$ gas supply path 38, the $NH_3$ gas supply path 39, the HF gas supply path 40, and the Ar gas supply path 41, respectively. V1 to V4 denote valves, which are provided in the $ClF_3$ gas supply path 38, the $NH_3$ gas supply path 39, the HF gas supply path 40, and the Ar gas supply path 41, respectively, and M1 to M4 denote flow rate adjustment parts. In order to individually supply each gas to the processing container 10 when supplying each gas to a wafer W, a gas inlet portion corresponding to each gas may be provided.

Returning to FIG. 1, the substrate processing apparatus includes a controller 9. The controller 9 includes, for example, a computer, and is provided with a program, memory, and a CPU. The program has a group of steps programmed so as to carry out a series of operations in the operation description to be described later, and the transfer of a wafer W, the heating of a wafer W, the adjustment of gas supply, and the like may be performed according to the program. This program is stored in a computer storage medium such as, for example, a flexible disk, a compact disk, a hard disk, or a magneto-optical disk to be installed in the controller 9.

Figure 3:
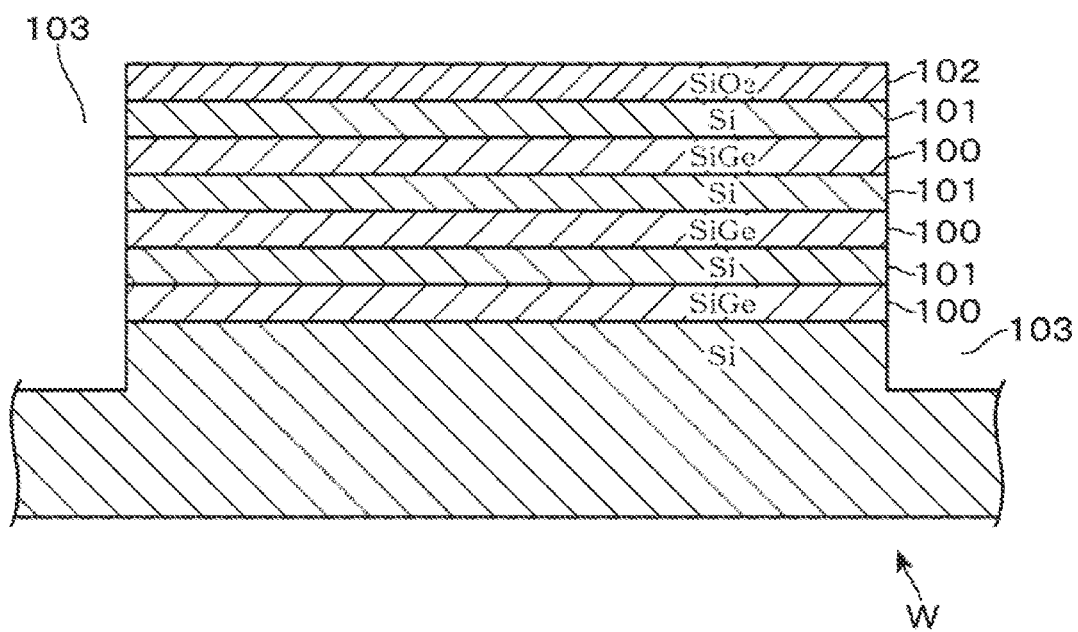
FIG. 3 is a cross-sectional view illustrating the vicinity of the surface of a wafer before an etching process.

An example of the surface structure of a wafer W, which is a substrate for manufacturing a semiconductor device used in a substrate processing method according to an embodiment of the present disclosure, will be described. FIG. 3 illustrates the cross-sectional structure of a wafer W in the intermediate step of a manufacturing process of a semiconductor device. This cross-sectional structure has a structure in which a plurality of SiGe layers 100X and Si layers 101 are alternately stacked on a wafer W, and a silicon oxide ($SiO_2$) layer 102 is further stacked on the surface of the Si layer 101. The wafer W on which respective layers are stacked is transferred to, for example, a plasma etching apparatus, recesses 103 are formed by plasma etching, and, as illustrated in FIG. 3, an SiGe layer 100 formed under an $SiO_2$ layer 102 and an Si layer 101 are alternately exposed in the recesses 103. Thereafter, the wafer W in which the recesses 103 are formed is, for example, subjected to a cleaning process, stored in a carrier C, and then carried into a substrate processing apparatus.

The operation of the substrate processing apparatus will be described. Wafers W, in which recesses 103 are formed by a plasma etching apparatus as described above, are placed on a load port 11 in the state of being stored in a carrier C. Next, the wafers W are taken out of the carrier C by the first transfer arm 20, and after eccentricity adjustment is performed in the alignment chamber 16, the wafers W are transferred to each load lock chamber 13. Subsequently, the atmosphere in the load lock chamber 13 is switched from the air atmosphere to the vacuum atmosphere, then the gate valves 22 and 23 are opened in the state in which the door valve 18 is closed, and a wafer W is transferred from the load lock chamber 13 by the second transfer arm 21. Then, the wafer W is placed on the mounting table 4 by the cooperative action of the second transfer arm 21 and the lift pins provided on the mounting table 4. Thereafter, the second transfer arm 21 is retracted to the load lock chamber 13, and the gate valves 22 and 23 are closed.

Figure 4:
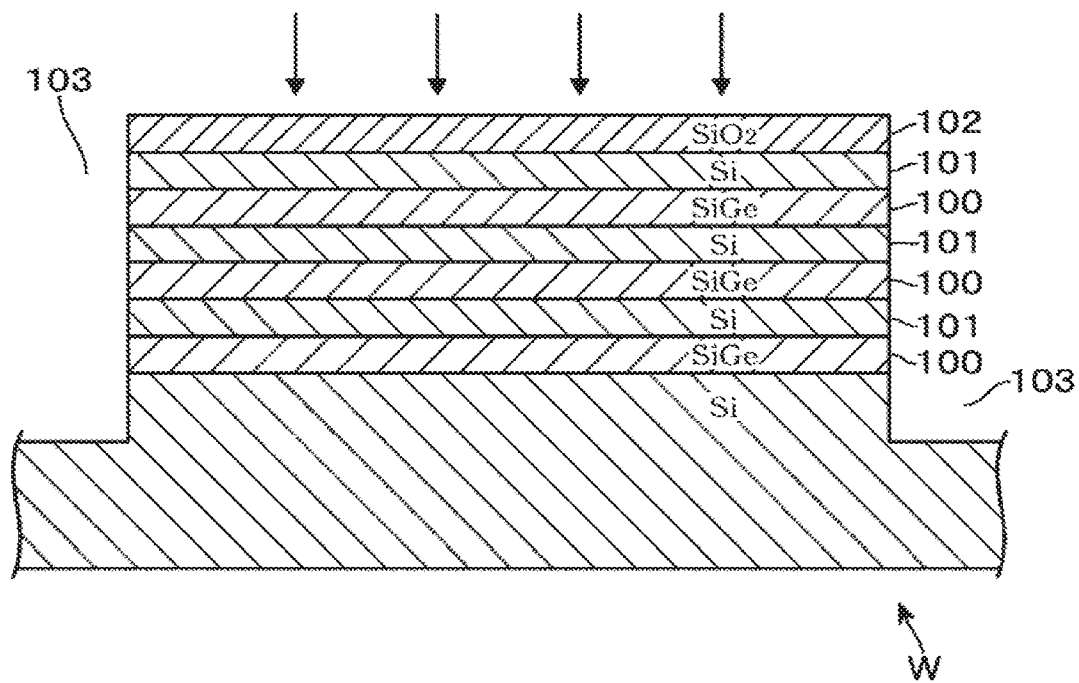
FIG. 4 is an explanatory view schematically illustrating removal of a natural oxide film of a wafer.

In the etching apparatus 3, the pressure in the processing container 10 is set to 10 to 500 mT (1.3 to 66.7 Pa), for example, 100 mT (13.3 Pa), and the temperature of the wafer W is adjusted to 0.1 to 100 degrees C., for example, 80 degrees C. Then, as illustrated in FIG. 4, each of $NH_3$ gas and HF gas is supplied to the wafer W at a flow rate of, for example, 50 to 300 sccm. Thus, when the wafer W is transferred from the plasma etching apparatus to the etching apparatus, a natural oxide film formed on the surface of the wafer W is removed. Next, Ar gas is supplied into the processing container 10, and evacuation is performed to replace the gas in the processing container 10.

Figure 5:
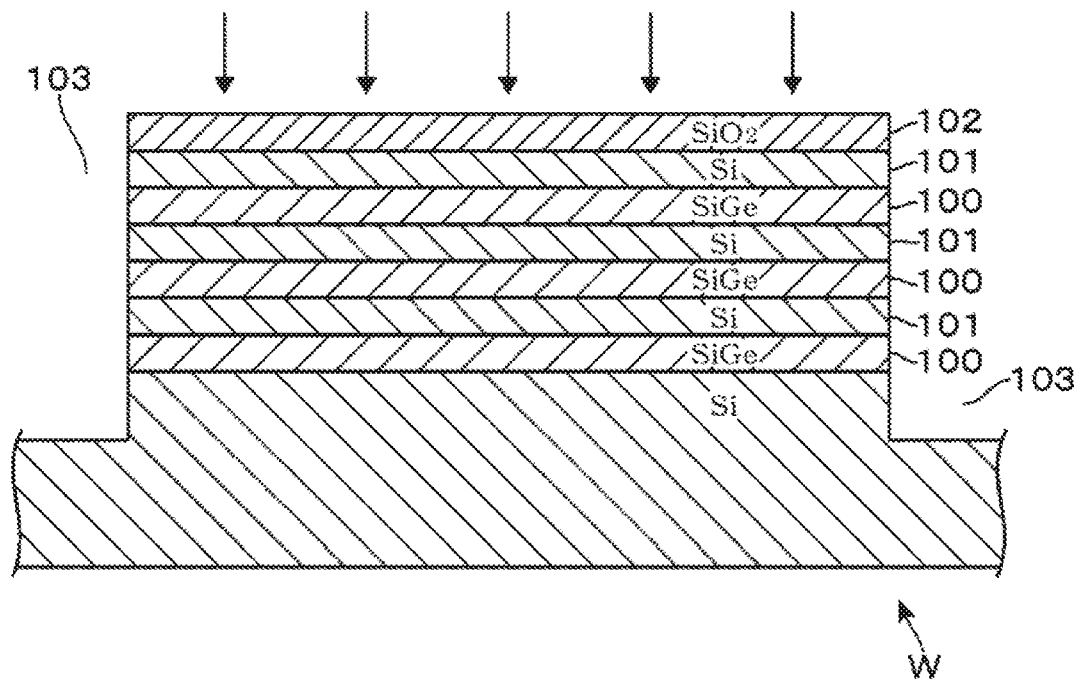
FIG. 5 is an explanatory view schematically illustrating etching of SiGe layers.
Figure 6:
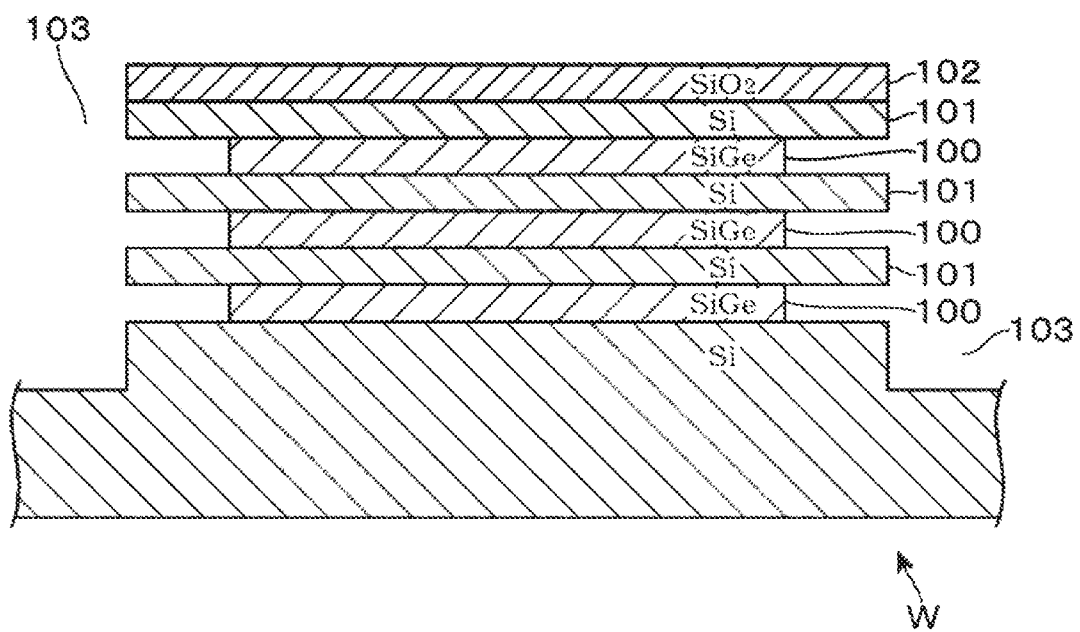
FIG. 6 is an explanatory view schematically illustrating the wafer after the etching.

Subsequently, as illustrated in FIG. 5, $ClF_3$ gas is supplied at a flow rate of 1 to 50 sccm, and HF gas is supplied at a flow rate of 5 to 500 sccm. At this time, the $ClF_3$ gas and the HF gas are supplied such that the flow rate of the $ClF_3$ gas and the flow rate of the HF gas are in the range described above, and such that the flow rate ratio of the flow rate of the $ClF_3$ gas to the flow rate of the HF gas is 1:5 or more (the flow rate of the HF gas/the flow rate of $ClF_3$ gas=5 or more). Thereby, a part of the SiGe layer 100 exposed in the recesses 103 is etched and removed. At this time, as illustrated in FIG. 6, the etching amounts of respective SiGe layers 100 become uniform.

Figure 7:
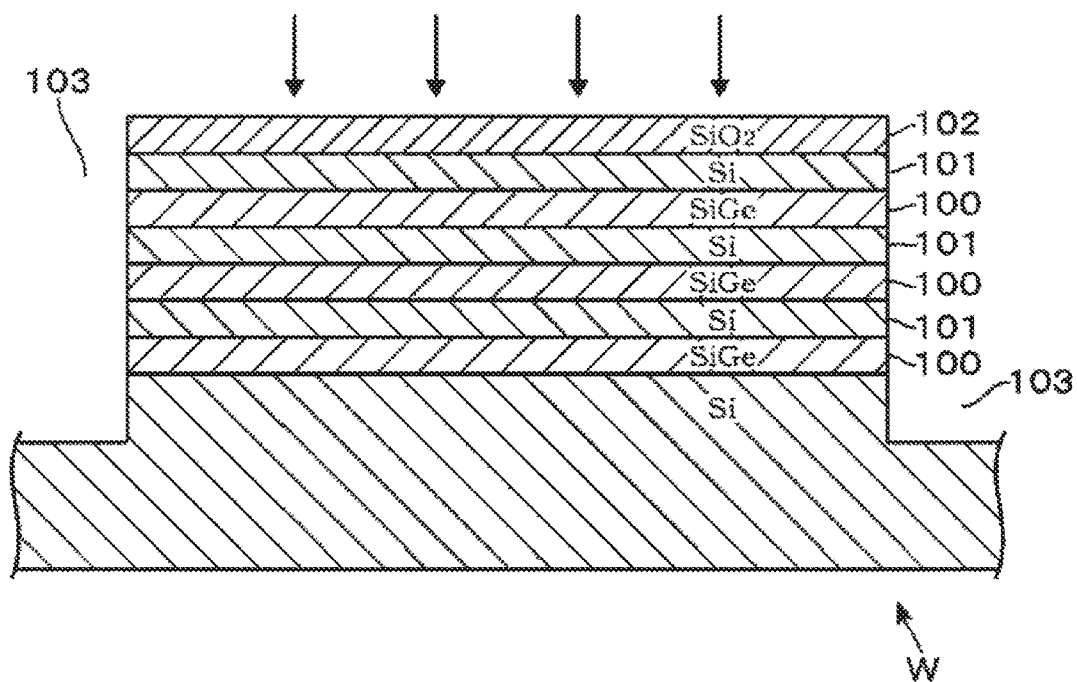
FIG. 7 is an explanatory view schematically illustrating conventional etching of SiGe layers.
Figure 8:
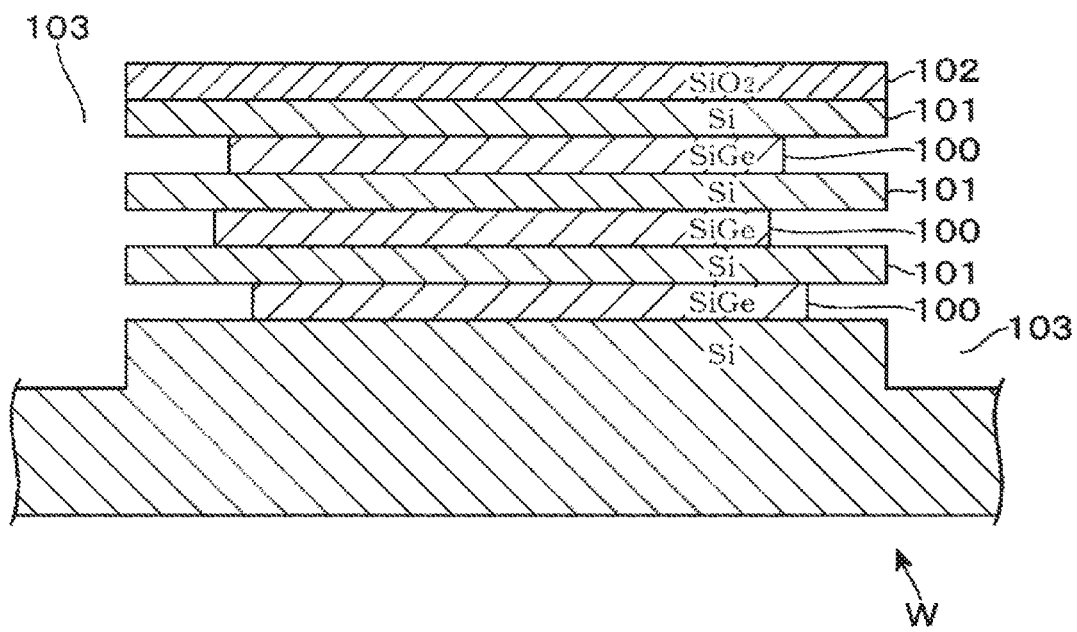
FIG. 8 is an explanatory view schematically illustrating conventional etching of SiGe layers.

Here, in the case in which each $NH_3$ gas and HF gas is supplied to the wafer W and then, as illustrated in FIG. 7, only $ClF_3$ gas is supplied without supplying HF gas to the wafer W as described in the background section, the etching amounts of respective SiGe layers 100 may not be uniform, as illustrated in FIG. 8. In contrast, when etching the SiGe layers 100 as illustrated in an example described later, the SiGe layers 100 are capable of being etched uniformly by simultaneously supplying $ClF_3$ gas and HF.

This mechanism is presumed as follows. As described above, before $ClF_3$ gas is supplied to a wafer W transferred to the etching apparatus, a mixed gas of $NH_3$ gas and HF gas is supplied to remove the natural oxide film formed on the surface of the wafer W. However, since the natural oxide film is not necessarily formed to have a uniform film thickness, the natural oxide film tends to partially remain on the surface of the wafer W. In addition, when it is intended to remove all the natural oxide film using the mixed gas of $NH_3$ gas and HF gas, $NH_3$ gas and HF gas will be supplied excessively in the portion in which the natural oxide film is thin, and $SiO_2$ layers 102, Si layers 101, etc. may be etched or the film quality may be deteriorated. Therefore, it is difficult to completely remove the natural oxide film on the surface of the wafer W.

Then, in the case in which removal of the natural oxide film is incomplete when $ClF_3$ gas is supplied to the wafer W to etch the SiGe layers 100, the etching rate of the SiGe layers 100 by $ClF_3$ may be reduced in a natural oxide film attachment portion. For this reason, as illustrated in FIG. 8, the etching amounts of respective SiGe layers 100 become not uniform.

Figure 9:
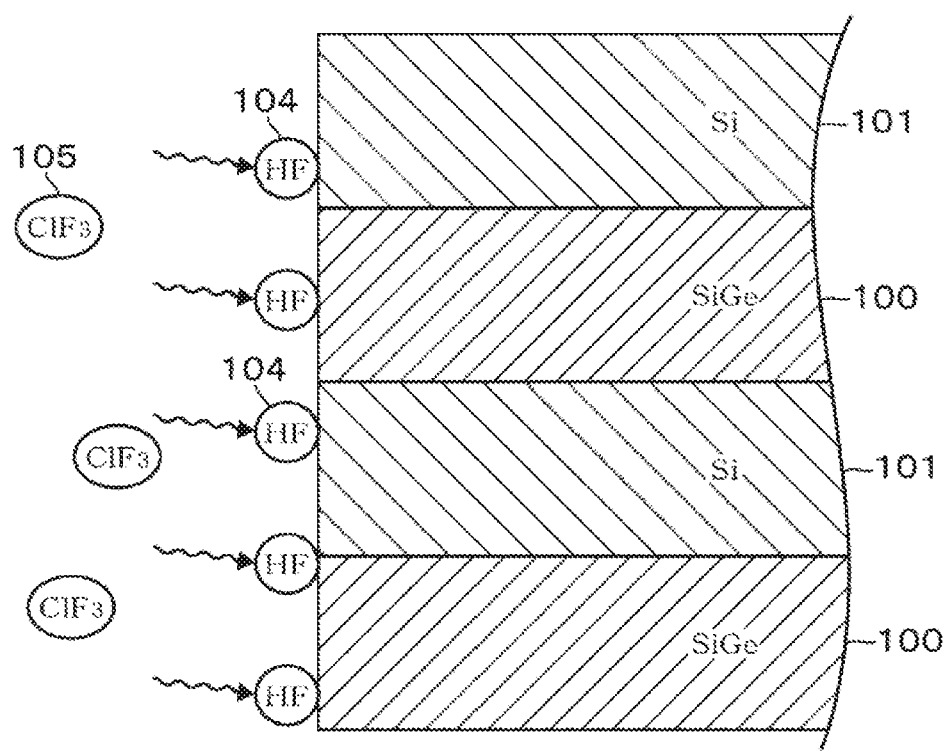
FIG. 9 is an explanatory view illustrating etching of SiGe layers.
Figure 10:
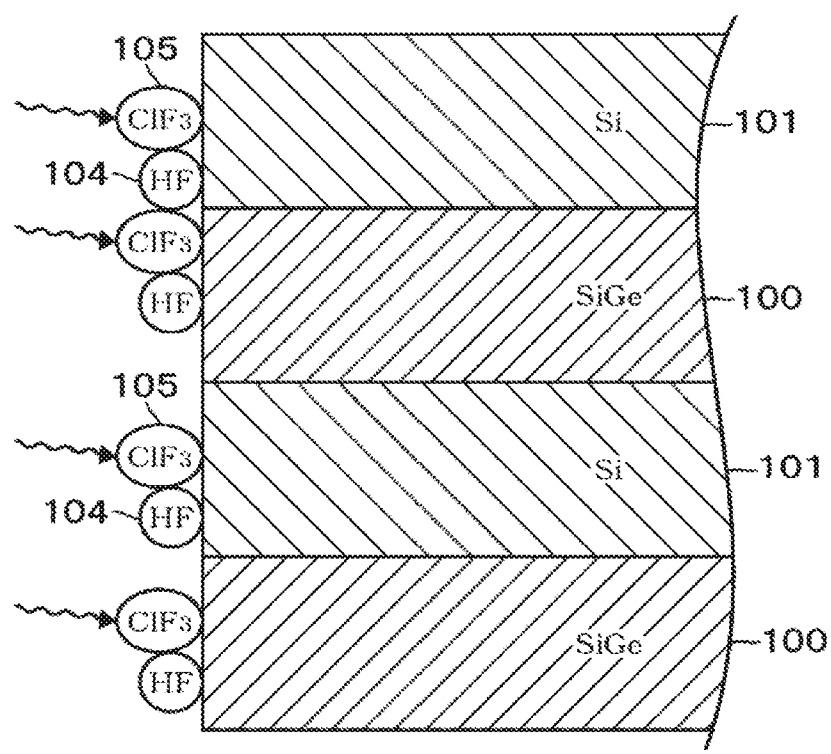
FIG. 10 is an explanatory view illustrating etching of SiGe layers.

In contrast, when $ClF_3$ gas and HF gas are simultaneously supplied, HF gas 104 is capable of being uniformly adsorbed to the surface of the wafer W before $ClF_3$ gas 105 is adsorbed to the wafer W as illustrated in FIG. 9 since HF gas has the property of being more easily adsorbed to the wafer W than $ClF_3$ gas. The HF gas 104 adsorbed in advance of the $ClF_3$ gas 105 removes the natural oxide film slightly remaining on the surface of the wafer W. Thereafter, the $ClF_3$ gas 105 is to be adsorbed to wafer W, but $ClF_3$ gas 105 tends to be adsorbed to HF gas 104. Thus, as illustrated in FIG. 10, the $ClF_3$ gas is adsorbed to the HF gas 104 uniformly adsorbed to the surface of wafer W, and thus the $ClF_3$ gas 105 is uniformly adsorbed to the surface of the wafer W. As described above, by simultaneously supplying $ClF_3$ gas and HF gas, the natural oxide film remaining on the surface of the wafer W is capable of being removed, and the $ClF_3$ gas is capable of being uniformly adsorbed to the surface of the wafer W. As a result, a difference in etching rate hardly occurs in respective SiGe layers 100, and the etching amounts become uniform.

Thereafter, Ar gas is supplied into the processing container 10 and vacuum evacuation is performed at the same time, the gas in the processing container 10 is replaced, and the etching of the wafer W is completed. The etched wafer W is transferred to the heat treatment apparatus 2 by the second transfer arm 21 and is placed on the mounting table 25 by the cooperative action of the second transfer arm 21 and the lift pins provided in the mounting table 25. Thus, the etching residue and the like attached to the wafer W are removed by heating. Thereafter, the wafer W is received by the second transfer arm 21, and is transferred in the substrate processing apparatus in the reverse order to the transfer of the wafer W from the carrier C to the load-lock chamber 13 so as to be returned to the carrier C.

According to the above-described embodiment, when the SiGe layers 100 are etched by side etching in the wafer W in which the alternately stacked SiGe layers 100 and Si layers 101 are exposed in the recesses 103, $ClF_3$ gas and HF gas are simultaneously supplied to the wafer W. Therefore, it is possible to make the etching amounts of respective SiGe layers 100 uniform.

In addition, by supplying the HF gas together with the $ClF_3$ gas, the $ClF_3$ gas is capable of being be uniformly adsorbed to respective SiGe layers 100. As a result, microloading of respective SiGe layers 100 is improved, and the surface after etching becomes flat. Furthermore, the etching rates of the SiGe layers 100 become uniform regardless of the remaining amount of the natural oxide film on the surface of the wafer W after the natural oxide film removal process. Therefore, the reproducibility in etching amount between different wafers W can be improved.

Furthermore, as described in the above embodiment, the effect is obtained by adsorbing HF gas to the surface of the wafer W before etching the SiGe layers 100 using $ClF_3$ gas. Therefore, after the removal of the natural oxide film on the surface of the wafer W is finished, the etching apparatus 3 supplies HF gas to the wafer W first in advance, and then supplies $ClF_3$ gas together with HF gas. The etching amounts of the SiGe layers 100 are capable of being more easily stabilized since the HF gas is capable of being surely adsorbed to the surface of the wafer W before the etching of the SiGe layers 100 by the $ClF_3$ gas is initiated.

Figure 11:
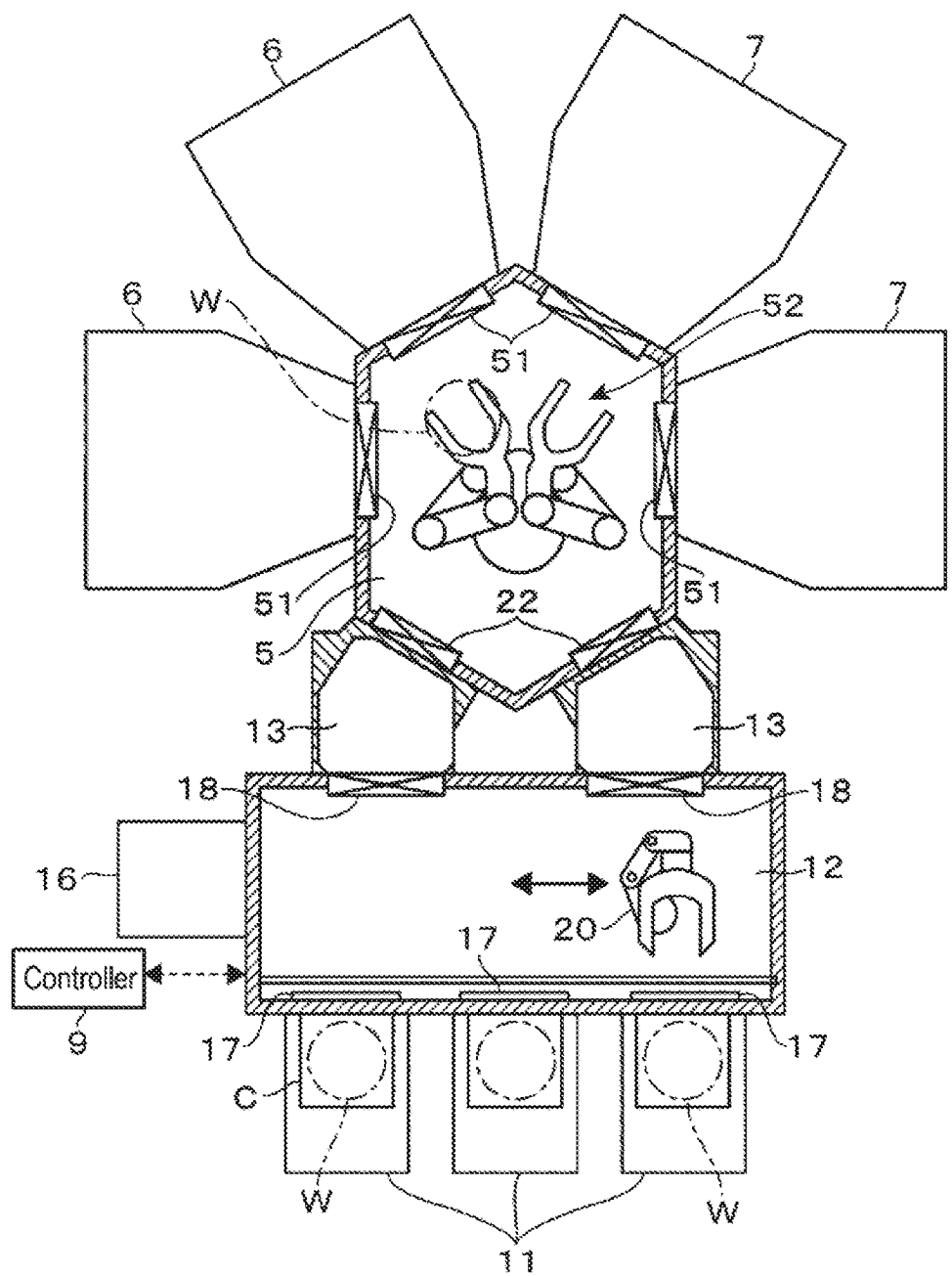
FIG. 11 is a plan view showing another example of a substrate processing apparatus.

In addition, an apparatus for removing a natural oxide film and an apparatus for etching SiGe layers 100 may be separately provided. Alternatively, the wafer W may not be heated after the etching of the SiGe layers 100. FIG. 11 illustrates an example of such a substrate processing apparatus, which is provided with load ports 11, a normal-pressure transfer chamber 12, and load-lock chambers 13, as in the substrate processing apparatus illustrated in FIG. 1, and a vacuum transfer chamber 5 for transferring a wafer W in a vacuum atmosphere is provided on the rear side of the load-lock chambers 13. Etching apparatuses 6 configured to supply HF gas and $ClF_3$ gas to a wafer W to etch SiGe layers and gas processing apparatuses 7 configured to supply $NH_3$ gas and HF gas to a wafer W to remove a natural oxide film are connected to the vacuum transfer chamber 5.

For example, the etching apparatuses 6 may be configured such that, in the etching apparatus 3 illustrated in FIG. 2, HF gas and $ClF_3$ gas or Ar gas are able to be further supplied into the processing container 10 from the gas inlet portion 36. In addition, the gas processing apparatus 7 configured to supply $NH_3$ gas and HF gas to a wafer W to remove a natural oxide film may be configured to be the same as the etching apparatus in FIG. 2 except that it is configured such that NH₃ gas, HF gas, and Ar gas are capable of being introduced from the gas inlet portion 36. In FIG. 11, reference numeral 51 denotes gate valves for partitioning spaces between the etching apparatuses 6 and the gas processing apparatuses 7 and the vacuum transfer chamber 5, and reference numeral 52 denotes transfer arms. In such a substrate processing apparatus, wafers W from which a natural oxide film has been removed by the gas processing apparatuses 7 are transferred to the etching apparatuses 7 through the vacuum transfer chamber 5. It is also possible to obtain the same effect in such a substrate processing apparatus.

In addition, when a wafer W is transferred from the gas processing apparatus 7 that removes a natural oxide film to the etching apparatus 6, the transfer may be performed in the air atmosphere. Since it is possible to quickly transfer the wafer W after the removal of the natural oxide film to the etching apparatus, almost no natural oxide film is formed. In addition, the wafer W after the removal of the natural oxide film may be cooled to 80 degrees C. or less. Since it is possible to quickly transfer the wafer W after the removal of the natural oxide film to the etching apparatus, the natural oxide film is hardly formed. However, since it is possible to suppress the formation of the natural oxide film by cooling the wafer W to 80 degrees or less after the processing of the natural oxide film, the effect is further enhanced.

In addition, as shown in a verification test described below, ClF₃ gas also exhibits a high selectivity with respect to SiO₂ layers 102 or SiN layers when etching SiGe layers 100. Therefore, the present disclosure is effective in the selective etching of SiGe layers 100 in a substrate on which SiO₂ layers 102 or SiN layers are formed together with the SiGe layers 100. In the specification, SiN is described as SiN regardless of the stoichiometric ratio of Si and N. Thus, the description SiN includes, for example, Si₃N₄. Further, as a gas to be supplied to the wafer W together with ClF₃ gas when etching the SiGe layers 100, a fluorine-containing gas, such as nitrogen trifluoride (NF₃) gas, fluorine (F₂) gas, or sulfur hexafluoride (SF₆) gas, may be used.

In addition, the SiO₂ layer 102 is easily etched in the natural oxide film removal step. Therefore, in the substrate in which an SiO₂ layer 102 is exposed on the surface, it is difficult to carefully remove a natural oxide film, and the natural oxide film tends to remain. Therefore, it is possible to obtain more effect in the etching of SiGe layers 100 in the substrate in which the SiO₂ layer is exposed on the surface.

Furthermore, when etching the SiGe layers 100 of the substrate having SiGe layers 100 and at least one of an Si layer 101, an SiO₂ layer 102, and an SiN layer formed on the surface thereof by ClF₃ gas, it is preferable to set the selection ratio of the Si layer 101, the SiO₂ layer 102, and the SiN layer with respect to the SiGe layers 100 to 50 or more. Therefore, when etching the SiGe layers 100, the processing temperature is preferably set to 0.1 to 100 degrees C. In addition, it is possible to obtain a good selection ratio at a pressure of 10 to 500 mT (1.3 to 66.7 Pa). In addition, it is preferable that the flow ratio of the flow rate of ClF₃ gas to the flow rate of fluorine-containing gas be set to 1:5 or more (the flow rate of HF gas/the flow rate of ClF₃ gas=5 or more), and it is preferable that the flow rate of ClF₃ gas is set to 1 to 50 sccm and the flow rate of HF gas is set to 5 to 500 sccm.

The present disclosure is not limited to the case of removing a part of the SiGe layers 100, but may be applied to etching for removing all the SiGe layers 100 without leaving the SiGe layers. Even in the etching for removing all the SiGe layers 100, for example, a difference in the exposure time of the layers, which are exposed due to the removal of the SiGe layers 100, to the ClF₃ gas occurs, which may result in partially deteriorated film quality. Therefore, according to the present disclosure, it is possible to suppress partial deterioration in film quality by making the etching rates of SiGe layers uniform.

[Verification Test]

Tests conducted to verify the effects of the present disclosure are described. The etching amounts of SiGe layers by ClF₃ gas and the etching selection ratios of an Si layer, an SiO₂ layer, and an SiN layer to the SiGe layers were examined. Using four evaluation substrates containing silicon, four types of evaluation substrates were manufactured by forming an SiGe layer on one substrate, and forming an Si layer, an SiO₂ layer, and an SiN layer on the other substrates, respectively. Then, after a natural oxide film was removed in the same manner as in the embodiment using the substrate processing apparatus provided with the etching apparatus 3 used in the embodiment illustrated in FIGS. 1 and 2, etching was performed by supplying a mixed gas of ClF₃ gas and Ar gas to each of the four evaluation substrates under the process conditions represented in the following test examples 1 to 3. Then, based on the etching amounts of respective evaluation substrates after the etching process, the etching amounts of the SiGe layer, the Si layer, the SiO₂ layer, and the SiN layer, and the etching selection ratios of the Si layer, the SiO₂ layer, and the SiN layer with respect to the SiGe layer were calculated in each test example.

Test Example 1

In order to investigate the influence of temperature on etching of SiGe layers by ClF₃ gas, etching was performed on the four types of evaluation substrates in the state in which, for each type of evaluation substrates, the temperature parameters were set to 0.1, 15, 30, 45, and 60 degrees C., respectively. As the other process conditions for etching, the pressure of the process container was set to 30 mT (4 Pa), the flow rate of ClF₃ gas was set to 10 to 30 sccm, the flow rate of Ar gas was set to 91 to 285 sccm, and the process time was set to 20 seconds.

Test Example 2

In order to investigate the influence of pressure on etching of SiGe layers by ClF₃ gas, etching was performed in the state in which the pressure parameters in the processing container 10 were set to 20, 30, and 40 mT (2.67, 4, and 5.33 Pa), respectively. As the other process conditions for etching, the temperature of the evaluation substrates was set to 30 degrees C., the flow rate of ClF₃ gas was set to 10 to 30 sccm, the flow rate of Ar gas was set to 91 to 285 sccm, and the process time was set to 20 seconds.

Test Example 3

In order to investigate the influence of the flow rate of ClF₃ gas on etching of SiGe layers by ClF₃ gas, etching was performed in the state in which the flow rate parameters of ClF₃ gas were set to 10, 20, and 30 sccm, respectively. As the other process conditions for etching, the temperature of the evaluation substrates was set to 30 degrees C. the pressure of the processing container was set to 30 mT (4 Pa), the flow rate of Ar gas was set to 91 to 285 sccm, and the process time was set to 20 seconds.

Figure 12:
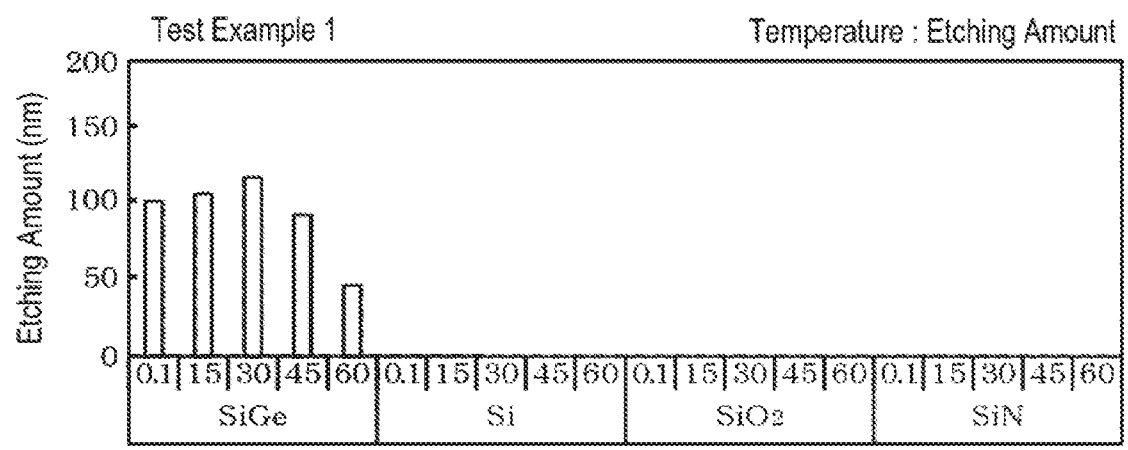
FIG. 12 is a characteristic diagram representing etching amounts in Test Example 1.
Figure 13:
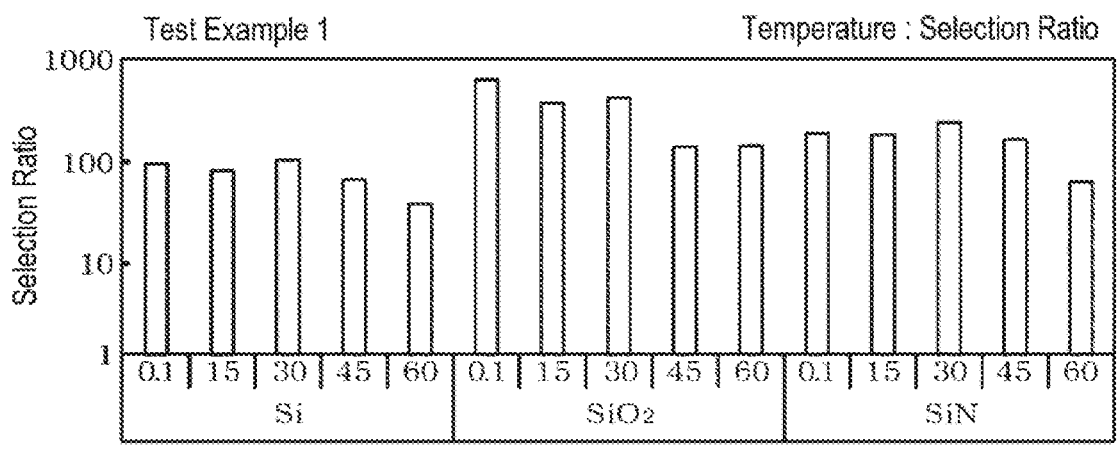
FIG. 13 is a characteristic diagram representing selection ratios with respect to SiGe in Test Example 1.
Figure 14:
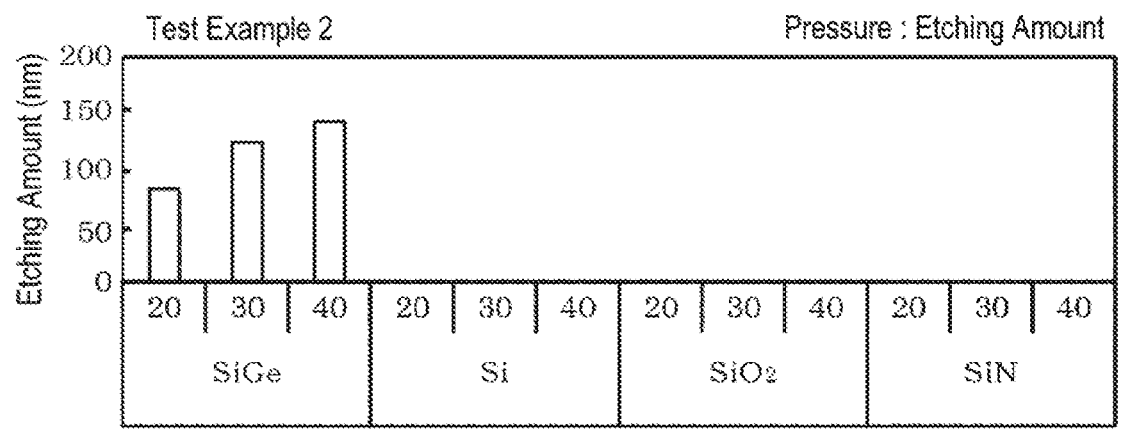
FIG. 14 is a characteristic diagram representing etching amounts in Test Example 2.
Figure 15:
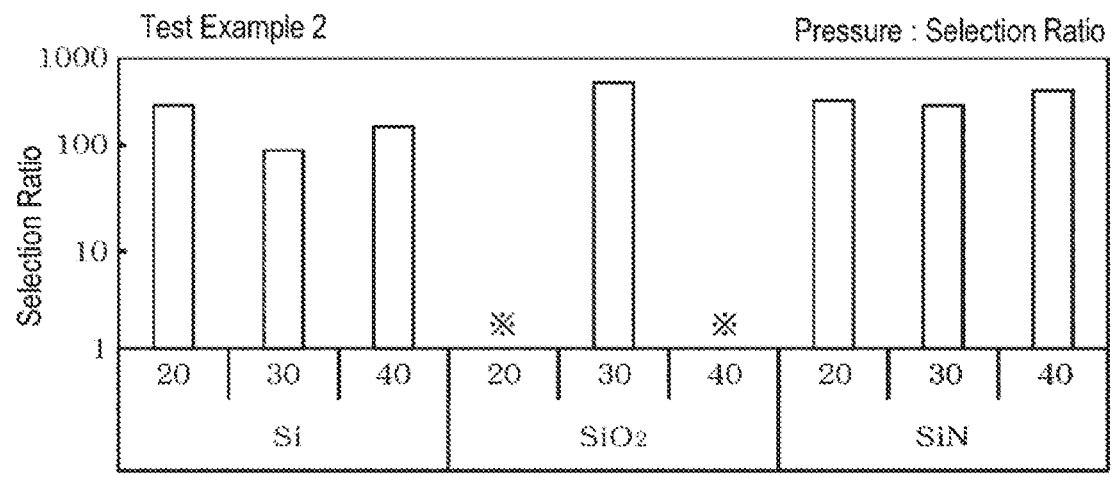
FIG. 15 is a characteristic diagram representing selection ratios with respect to SiGe in Test Example 2.
Figure 16:
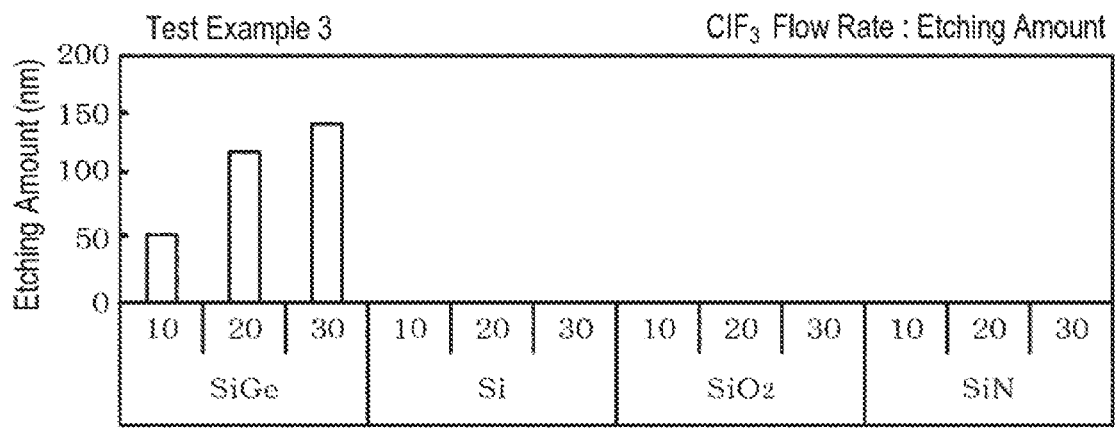
FIG. 16 is a characteristic diagram representing etching amounts in Test Example 3.

The etching amounts when respective evaluation substrates were etched according to Test Examples 1 to 3 are shown in FIGS. 12, 14, and 16 for each of Test Examples 1 to 3. In addition, the selection ratios of the SiGe layers with respect to other types of layers calculated from the etching amounts of the four types of evaluation substrates in Test Examples 1 to 3 are shown in FIGS. 13, 15 and 17 for each of Test Examples 1 to 3.

In FIGS. 12, 14, and 16, the etching amounts in SiGe layers, the etching amounts in Si layers, the etching amounts in $SiO_2$ layers, and the etching amounts in the SiN layers are illustrated side by side from the left, when the figure is viewed from the front, in respective groups. The numerical values indicated below respective graphs in the respective graph groups of the SiGe layers, the Si layers, the $SiO_2$ layers, and the SiN layer are the setting values of the respective parameters of temperature, pressure, and flow rate of $ClF_3$ gas varied in the corresponding test examples.

Figure 17:
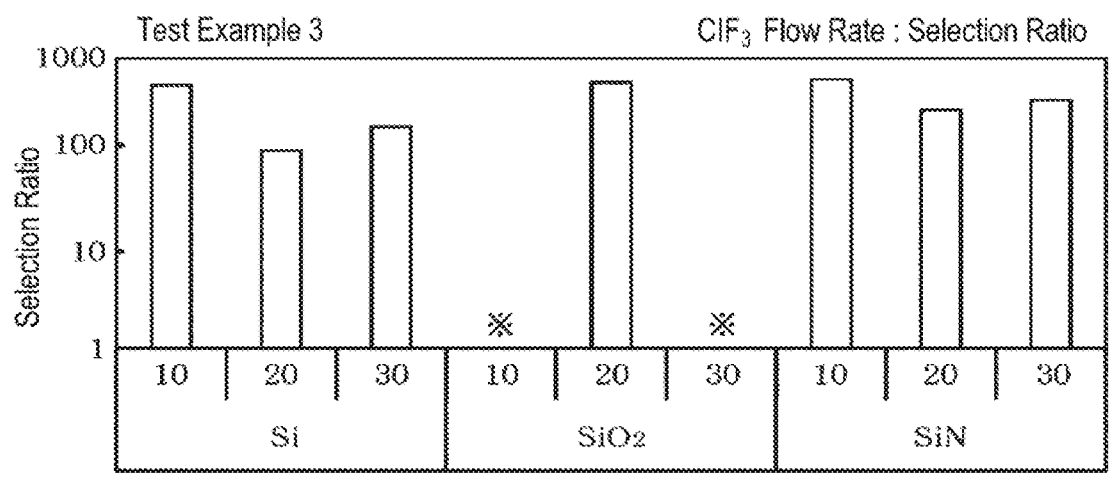
FIG. 17 is a characteristic diagram representing selection ratios with respect to SiGe in Test Example 3.

In FIGS. 13, 15, and 17, the etching selection ratios of SiGe layers with respect to Si layers, the etching selection ratios of SiGe layers with respect to $SiO_2$ layers, the etching selection ratios of SiGe layers with respect to SiN layers are illustrated side by side from the left, when the figure is viewed from the front, in respective groups. The numerical values indicated below respective graphs in the respective graph groups are the setting values of the respective parameters of temperature, pressure, and flow rate of $ClF_3$ gas varied in the corresponding test examples.

In addition, "X" described in FIGS. 15 and 17 indicates the tests in which the selection ratios showed negative values since the etching amounts of $SiO_2$ layers were measured as negative values. Since an etching amount of a negative value is estimated to be approximately zero, the substantial selection ratio is considered to be approximately infinite.

When the processing temperature was set to 0.1 to 60 degrees C., the pressure was set to 20 to 40 mT, the $ClF_3$ flow rate was set to 10 to 30 sccm, and the Ar flow rate was set to 91 sccm to 285 sccm as shown in FIGS. 12, 14, and 16, in each case, the etching amounts of SiGe layers were large, and Si layers, $SiO_2$ layers, and SiN layers were hardly etched. Therefore, the etching selection ratios of Si layers, $SiO_2$ layers, and SiN layers with respect to SiGe layers showed high values of 50 or more. It can be said that, in the setting values of these parameters, $ClF_3$ gas is capable of etching SiGe layers with a high etching selection ratio with respect to each of Si layers, $SiO_2$ layers, and SiN layers.

Example

In order to verify the effects of the embodiment of the present disclosure, the natural oxide film removal step was performed on the wafers W, on which the recesses 103 illustrated in FIG. 3 were formed, as illustrated in FIG. 4, etching of the SiGe layers 100 was performed using the etching apparatus 3 illustrated in FIG. 2, as illustrated in the embodiment. In the etching, the flow rate of $ClF_3$ gas was set to 10 to 30 sccm, the flow rate of HF gas was set to 91 to 285 sccm, the temperature of the wafer W was set to 30 degrees C., and the pressure of the processing container 10 was set to 30 mT (4 Pa). In addition, an example, which was processed in the same manner as the example described above except that Ar gas was supplied instead of HF gas, was set as a comparative example.

Figure 18:
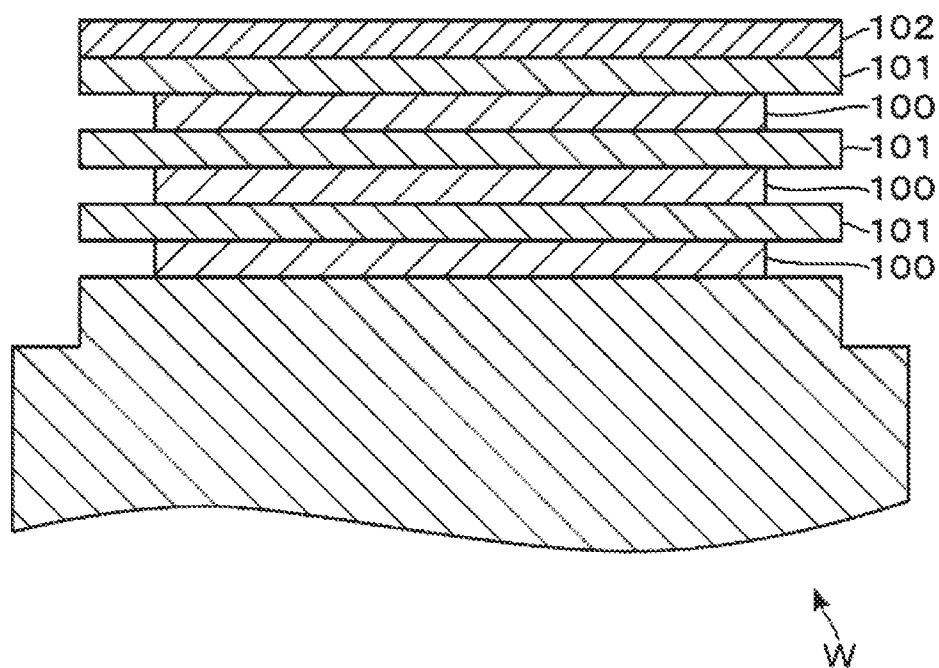
FIG. 18 is a schematic view for explaining a cross section of a surface portion of a wafer in an example.
Figure 19:
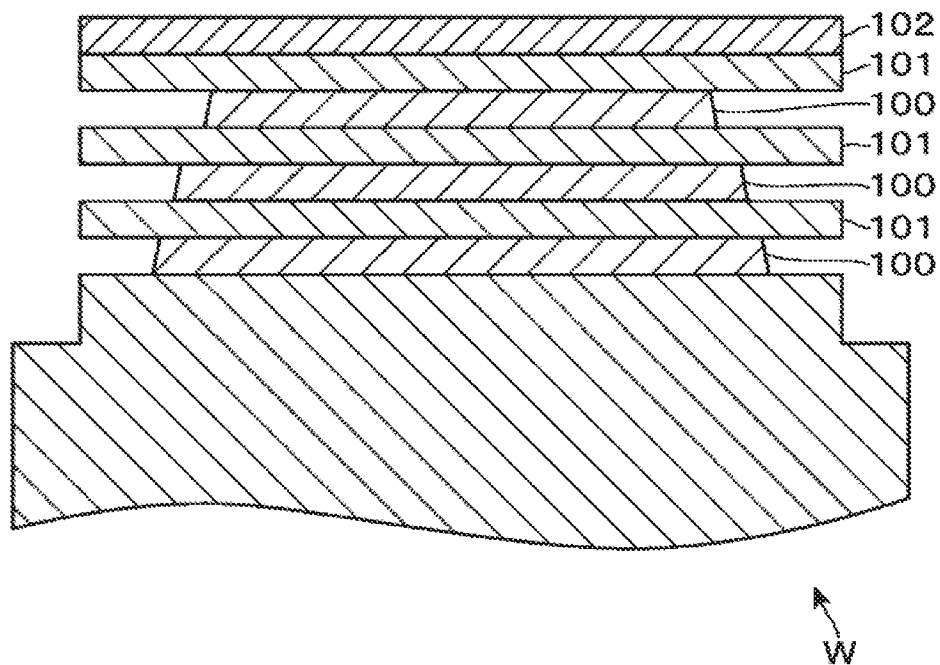
FIG. 19 is a schematic view illustrating a cross section of a surface portion of a wafer in a comparative example.

FIGS. 18 and 19 are explanatory views schematically illustrating the appearances of the surfaces of wafers W in the example and the comparative example, respectively. While the etching amounts of SiGe layers 100 are uniform in the embodiment as represented in FIG. 18, the etching amounts of SiGe layers 100 are not uniform in the comparative example as illustrated in FIG. 19. According to this result, it can be said that it is possible to make the etching amounts of SiGe layers 100 uniform by applying the etching method of the present disclosure to the etching of SiGe layers 100 in a wafer W in which the SiGe layers 100, Si layers 101, and $SiO_2$ layers 102 are exposed.

DESCRIPTION OF REFERENCE NUMERALS

2: heat treatment apparatus
3: etching apparatus
4: mounting table
10: processing container
31: exhaust port
36: gas inlet portion
100: SiGe layer
101: Si layer
102: $SiO_2$ layer
103: recess
104: HF gas
105: $ClF_3$ gas
W: wafer

What is claimed is:

1. A substrate processing method of etching a silicon germanium layer in a substrate in which the silicon germanium layer and at least one of a silicon layer, a silicon oxide layer, and a silicon nitride layer are exposed, the method comprising:
   removing a portion of a natural oxide film on a surface of the substrate by supplying a processing gas to the substrate; and
   subsequently, etching the silicon germanium layer such that a portion of the silicon germanium layer remains and removing the natural oxide film remaining on the surface of the substrate by supplying a fluorine-containing gas in advance and then supplying a chlorine trifluoride gas together with the fluorine-containing gas to the substrate in a processing container, which is in a vacuum atmosphere,
   wherein the fluorine-containing gas is a hydrogen fluoride gas.

2. The substrate processing method of claim 1, wherein the substrate includes a stacked structure in which silicon layers and silicon germanium layers are alternately stacked and end surfaces of respective layers are exposed.

3. The substrate processing method of claim 1, wherein a flow rate ratio of the fluorine-containing gas to a flow rate of the chlorine trifluoride gas (the flow rate of the fluorine-containing gas/the flow rate of the chlorine trifluoride gas) is 5 or more.

4. The substrate processing method of claim 1, wherein a temperature of the substrate in the supplying the fluorine-containing gas in advance and then the supplying the chlorine trifluoride gas together with the fluorine-containing gas is 0.1 to 100 degrees C.

5. The substrate processing method of claim 1, wherein a pressure in the processing container in the supplying the fluorine-containing gas in advance and then the supplying the chlorine trifluoride gas together with the fluorine-containing gas is 1.3 to 66.7 Pa.

6. The substrate processing method of claim 1, further comprising:

forming a recess in the substrate in which the silicon germanium layer and at least one of the silicon layer, the silicon oxide layer, and the silicon nitride layer are formed by plasma etching.

7. The substrate processing method of claim 6, wherein the silicon germanium layer in the recess in which the silicon germanium layer and at least one of the silicon layer, the silicon oxide layer, and the silicon nitride layer are exposed is etched by supplying the fluorine-containing gas and the chlorine trifluoride gas to the substrate.

8. A non-transitory computer-readable storage medium storing a computer program used in a substrate processing apparatus that supplies a gas to a substrate in a processing container having a vacuum atmosphere so as to perform a process, wherein the computer program has a group of steps programmed for carrying out the substrate processing method according to claim 1.

\* \* \* \* \*